(12) United States Patent
Khoini-Poorfard (10) Patent No.: US 8,238,867 B1
(45) Date of Patent: Aug. 7, 2012

(54) LOW NOISE AMPLIFIER (LNA) SUITABLE FOR USE IN DIFFERENT TRANSMISSION ENVIRONMENTS AND RECEIVER USING SUCH AN LNA

(75) Inventor: Ramin Khoini-Poorfard, Austin, TX (US)

(73) Assignee: Silicon Laboratories Inc, Austin, TX (US)

( * ) Notice: Subject to any disclaimer, the term of this patent is extended or adjusted under 35 U.S.C. 154(b) by 0 days.

(21) Appl. No.: 13/036,892

(22) Filed: Feb. 28, 2011

(51) Int. Cl.
*H04B 1/16* (2006.01)

(52) U.S. Cl. .................. 455/341; 455/252.1; 455/127.1; 455/127.2; 455/232.1; 455/234.1; 330/254

(58) Field of Classification Search .................. 455/341, 455/252.1, 127.1, 127.2, 232.1, 234.1; 330/254
See application file for complete search history.

(56) References Cited

U.S. PATENT DOCUMENTS

| | | | |
|---|---|---|---|
| 6,809,581 B2 | 10/2004 | Rofougaran et al. | |
| 6,972,625 B2 * | 12/2005 | Nguyen et al. ................. | 330/254 |
| 7,446,613 B2 | 11/2008 | Westwick et al. | |
| 7,596,364 B2 | 9/2009 | Sjoland | |
| 7,786,806 B2 * | 8/2010 | Duperray ...................... | 330/311 |
| 7,848,724 B2 * | 12/2010 | Bult et al. ................... | 455/252.1 |
| 7,983,625 B2 * | 7/2011 | Granata .......................... | 455/78 |

OTHER PUBLICATIONS

W. Zhuo, X. Li, S. Shekhar, S. H. K. Embabi, J. Pineda De Gyvez, D. J. Allstot, and E. Sanchezsinencio; A Capacitor Cross-Coupled Common-Gate Low-Noise Amplifier; Journal; Dec. 2005; pp. 875-879; IEEE Transactions on Circuits and Systems-II: Express Briefs, vol. 52 No. 12; IEEE, 10662 Los Vaqueros Circle, Los Alamitos, CA, 90720-1264, U.S.A.

Federico Bruccoleri, Eric A. M. Klumperink, and Bram Nuata; Wide-Band CMOS Low-Noise Amplifier Exploiting Thermal Noise Canceling; Journal; Feb. 2004; pp. 275-282; IEEE Journal of Solid-State Circuits, vol. 39, No. 2; IEEE, 10662 Los Vaqueros Circle, Los Alamitos, CA, 90720-1264, U.S.A.

Chun-Huat Heng, Manoj Gupta, Sang-Noon Lee, David Kang, and Bang-Sup Song; A CMOS TV Tuner/Demodulator IC with Digital Image Rejection; Journal; Dec. 2005; pp. 2525-2535; IEEE Journal of Solid-State Circuits, vol. 40, No. 12; IEEE, 10662 Los Vaqueros Circle, Los Alamitos, CA, 90720-1264, U.S.A.

Actions on the Merits in copending U.S. Appl. No. 12/493,034, filed Jun. 29, 2009.

* cited by examiner

*Primary Examiner* — Sanh Phu
(74) *Attorney, Agent, or Firm* — Polansky & Associates, P.L.L.C.; Paul J. Polansky (57) ABSTRACT

A low-noise amplifier includes first and second transconductance paths and first and second variable capacitive dividers. The first transconductance path has a first terminal for receiving a first input signal, a control terminal, and a second terminal for providing a first output signal. The second transconductance path has a first terminal for receiving a second input signal, a control terminal, and a second terminal for providing a second output signal. The first variable capacitive divider has a first terminal for receiving the first input signal, a second terminal coupled to a reference voltage terminal, and an intermediate terminal coupled to the control terminal of the second transconductance path. The second variable capacitive divider has a first terminal for receiving the second input signal, a second terminal coupled to the reference voltage terminal, and an intermediate terminal coupled to the control terminal of the first transconductance path.

20 Claims, 4 Drawing Sheets

LOW NOISE AMPLIFIER (LNA) SUITABLE FOR USE IN DIFFERENT TRANSMISSION ENVIRONMENTS AND RECEIVER USING SUCH AN LNA

CROSS REFERENCE TO RELATED, COPENDING APPLICATION

Related subject matter is found in a copending patent application entitled "Low-Noise Amplifier Suitable for Use in a Television Receiver," application Ser. No. 12/493,034, invented by Abhishek V. Kammula, Aslamali A. Rafi, and George Tyson Tuttle, filed Jun. 26, 2009 and assigned to the assignee hereof.

FIELD OF THE DISCLOSURE

The present disclosure relates generally to amplifiers and, more particularly to low-noise amplifiers suitable for use in radio frequency (RF) receivers.

BACKGROUND

A radio frequency (RF) signal includes useful information that is modulated onto a carrier signal. An RF receiver retrieves the useful information from the RF signal. RF receivers are used in a wide variety of applications such as television transmission, cellular telephones, pagers, global positioning systems (GPS), cable modems, cordless phones, satellite radios, and the like. As used herein, an RF signal means an electro-magnetic signal having a frequency in a spectrum from about 3 kilohertz (kHz) to thousands of gigahertz (GHz), regardless of the medium through which such signal is conveyed. Thus an RF signal may be transmitted through air, free space, coaxial cable, fiber optic cable, etc.

In television (TV) systems, the frequency spectrum is relatively wide and is divided into separate channels that include different programming content. A TV receiver receives the wide spectrum RF signal and typically filters the wideband signal using a tracking filter tuned to the desired channel to reject unwanted signal content. The TV receiver then mixes the desired channel to a convenient intermediate frequency (IF) to make it easier to further filter the signal, and then demodulates it to recover the channel information. For example, a TV receiver designed for North American broadcasts (NTSC) translates a 6 megahertz (MHz) channel in the frequency spectrum of 48 MHz to 870 MHz to an intermediate frequency (IF) of 44 MHz for demodulation.

Not only do TV receivers require the ability to tune channels from a wideband signal, but they are often required to operate in vastly different transmission environments. For example, an over-the-air (i.e. terrestrial) TV transmission is characterized by widely varying channel signal levels resulting from different distances from fixed position broadcast antennas. To receive a terrestrial TV signal under all conditions, it is necessary to amplify potentially weak signals, and thus it is important for the receiver to maximize the signal-to-noise ratio (or conversely to minimize the noise figure (NF)). On the other hand, cable TV transmission is characterized by a large number of closely-spaced channels having uniform signal strengths. Thus while cable channels have adequate signal-to-noise ratio, the cable must be properly terminated to avoid creating large standing waves which create interference and degrade the signal. The degree of proper termination is usually measured by a parameter known as reflection loss (RL).

Historically when a user desired to adapt a terrestrial TV receiver for a cable television system, he or she typically rented a set-top-box (STB) that decoded the cable channels and remodulated them onto a particular terrestrial channel, such as channel 3 or channel 4. The STB could also conveniently be used to decode certain encrypted premium channels.

More recently it has become important for TV receivers to be able to directly tune both terrestrial and cable channels without the need for a separate set top box. The differences in the transmission environment make it difficult to design a low cost receiver which makes use of integrated circuit technology and avoids the need for costly, discrete components while still supporting both environments, due to the inherent tradeoff between good NF and good RL.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

Figure 1:
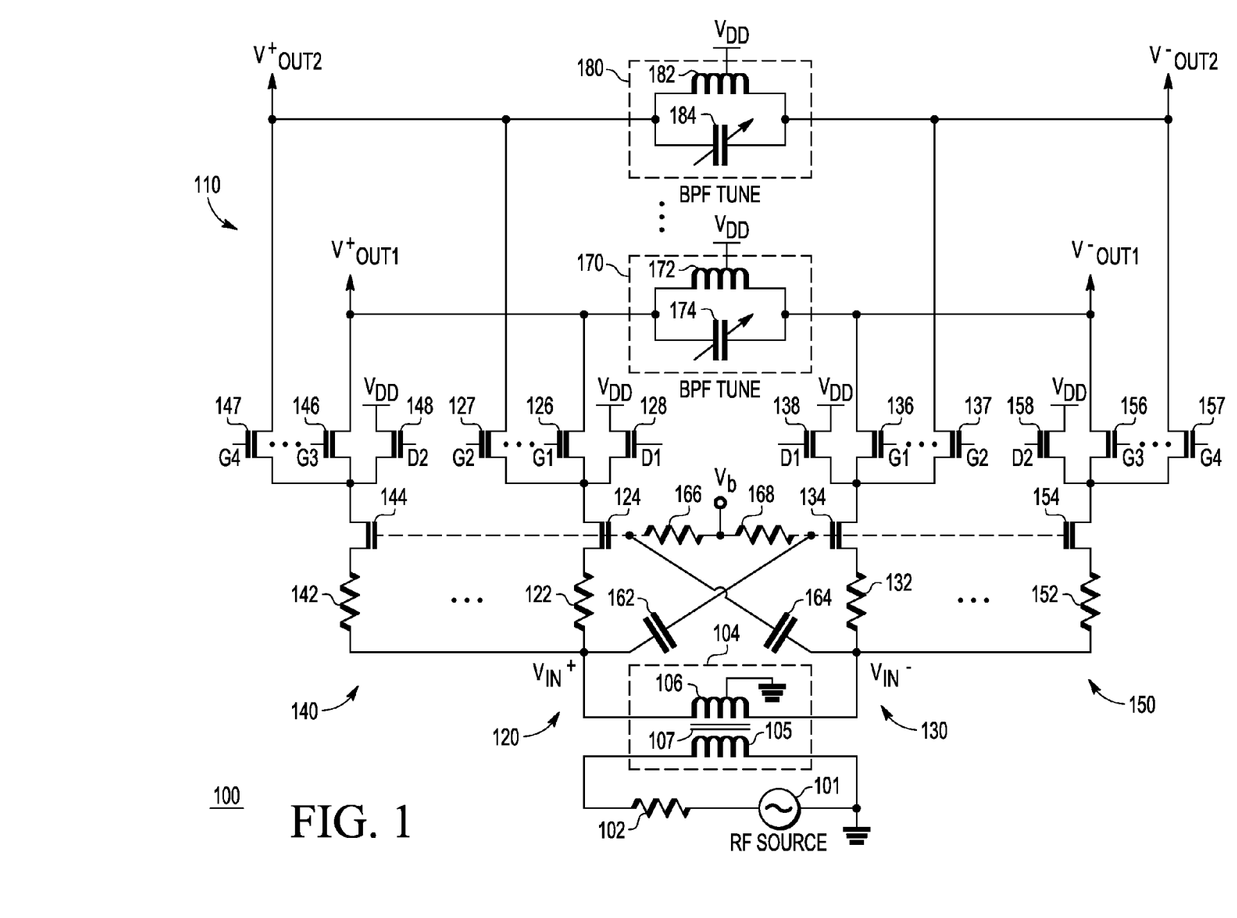
FIG. 1 illustrates in schematic form a portion of a television system including a receiver front end having a low noise amplifier (LNA)

FIG. 1 illustrates in schematic form a portion of a television system 100 including a receiver front end having a low noise amplifier (LNA) 110. Television system 100 generally includes a radio frequency (RF) voltage source 101 in series with a resistor 102, a balanced-unbalanced ("balun") transformer 104, LNA 110, and tunable bandpass filters 170 and 180. RF source 101 represents any of a variety of voltage sources for transmitting modulated television signals including a power amplifier driving a broadcast antenna, a cable television repeater, and the like. Resistor 102 represents the characteristic impedance of the transmission medium. For example in terrestrial transmission systems, resistor 102 is the radiation resistance and is widely varying depending on the size of the transmission antenna and its surroundings. In cable television systems, resistor 102 corresponds to the characteristic impedance of the coaxial cable used as the transmission medium and having a value of, for example 75Ω. FIG. 1 illustrates RF source 101 as having a first terminal connected to a first terminal of resistor 102, and a second terminal connected to ground.

RF source 101 thus transmits an RF signal to first and second terminals on the primary side of balun transformer 104. Balun transformer 104 includes a first winding 105, a second winding 106, and a magnetic core 107. First winding 105 has a first terminal connected to the second terminal of resistor 102, and a second terminal connected to ground. Second winding 106 has a first terminal for providing a positive component of a differential signal that is input to LNA 120 labeled "$V_{IN}^+$", a second terminal for providing a negative component of the different input signal that is input to LNA 102 labeled "$V_{IN}^-$", and a center tap connected to ground.

LNA 110 has multiple legs including representative legs 120, 130, 140, and 150 that are used to form multiple output signals in a manner that will be described as follows. Leg 120 includes a resistor 122 and N-channel metal-oxide-semiconductor (MOS) transistors 124, 126, 127, and 128. Note that as used herein "MOS" transistors designate all types of insulated-gate field effect transistors whether or not they include metal in their gates, as the term "MOS" is commonly applied in the industry. Resistor 122 has a first terminal for receiving signal $V_{IN}^+$, and a second terminal. Transistor 124 has a first source/drain terminal connected to the second terminal of resistor 122, a gate, and a second source/drain terminal. Transistor 126 has a first source/drain terminal connected to the second source/drain terminal of transistor 124, a gate for receiving a signal labeled "G1", and a second source/drain terminal for providing an output signal labeled "$V^+_{OUT1}$". Transistor 127 has a first source/drain terminal connected to the second source/drain terminal of transistor 124, a gate for receiving a signal labeled "G2", and a second source/drain terminal for providing an output signal labeled "$V^+_{OUT2}$". Transistor 128 has a first source/drain terminal connected to the second source/drain terminal of transistor 124, a gate for receiving a signal labeled "D1", and a second source/drain terminal connected to a power supply terminal labeled "$V_{DD}$". $V_{DD}$ is positive with respect to ground and will have a voltage appropriate to the process technology used, such as 2.0 volts. Leg 130 includes a resistor 132 and N-channel MOS transistors 134, 136, and 138. Resistor 132 has a first terminal for receiving signal $V_{IN}^-$, and a second terminal. Transistor 134 has a first source/drain terminal connected to the second terminal of resistor 132, a gate, and a second source/drain terminal. Transistor 136 has a first source/drain terminal connected to the second source/drain terminal of transistor 134, a gate for receiving signal G1, and a second source/drain terminal for providing an output signal labeled "$V^-_{OUT1}$". Transistor 137 has a first source/drain terminal connected to the second source/drain terminal of transistor 134, a gate for receiving signal G2, and a second source/drain terminal for providing an output signal labeled "$V^-_{OUT2}$". Transistor 138 has a first source/drain terminal connected to the second source/drain terminal of transistor 134, a gate for receiving signal D1, and a second source/drain terminal connected to $V_{DD}$. LNA 110 has an arbitrary number N pairs of selectively switched weighted legs for gain control, such as a representative $N^{th}$ pair formed by legs 140 and 150. Leg 140 is on the $V^+_{OUT}$ side and has elements corresponding to those in leg 120 in which transistors 146, 147, and 148 receive input signals labeled "$G_3$", "$G_4$", and "$D_2$", respectively. Leg 150 is on the $V^-_{OUT}$ side and has elements corresponding to those in leg 130 in which transistors 156, 157, and 158 receive input signals $G_3$, $G_4$, and $D_2$, respectively. Moreover, the legs can include an arbitrary number of transistors such as representative transistors 126 and 127 in leg 120, for example, which form multiple LNA outputs. In the embodiment referenced in this FIG. 1, there are a total of five output pairs that drive five different bandpass filters. By processing the input signal in a selected one of five LNA segments each with its own bandpass filter, corresponding to five contiguous frequency bands of the wideband television spectrum, each bandpass filters can be tailored to provide better frequency selectivity over its corresponding band.

Capacitor 162 has a first terminal for receiving signal $V_{IN}^+$, and a second terminal connected to the gate of transistor 134 and to the gates of all corresponding transistors that are part of the second leg in their corresponding pairs. Capacitor 164 has a first terminal for receiving signal $V_{IN}^-$, and a second terminal connected to the gate of transistor 124 and to the gates of all corresponding transistors that are part of the first leg in their corresponding pairs. Resistor 166 has a first terminal connected to the gate of transistor 124, and a second terminal for receiving a bias voltage labeled "$V_b$". Resistor 168 has a first terminal connected to the gate of transistor 134, and a second terminal for receiving bias voltage $V_b$.

Tunable bandpass filter 170 includes an inductor 172 and a variable capacitor 174. Inductor 172 has a first terminal connected to the second source/drain terminals of transistors 126 and 146, a second terminal connected to the second source/drain terminals of transistors 136 and 156, and a center terminal connected to $V_{DD}$. Capacitor 174 has a first terminal connected to the second source/drain terminals of transistors 126 and 146, a second terminal connected to the second source/drain terminals of transistors 136 and 156, and a tuning input for receiving a tuning signal labeled "BPF TUNE". Tunable bandpass filter 180 includes an inductor 182 and a variable capacitor 184. Inductor 182 has a first terminal connected to the second source/drain terminals of transistors 127 and 147, a second terminal connected to the second source/drain terminals of transistors 137 and 157, and a center terminal connected to $V_{DD}$. Capacitor 184 has a first terminal connected to the second source/drain terminals of transistors 127 and 147, a second terminal connected to the second source/drain terminals of transistors 137 and 157, and a tuning input for receiving signal BPF TUNE.

In operation, LNA 110 receives and amplifies a differential RF input signal formed by signals $V_{IN}^+$ and $V_{IN}^-$ and, lacking the large inductors associated with conventional LNAs, is suitable for integration without the addition of costly external components. Each leg on the positive output side is matched with a corresponding leg on the negative output side to form a pair of legs, and has component sizes weighted with respect to other legs to offer a wide gain range. Each set of transistors such as 126, 127, and 128 selectively switches an input current to either the $V^+_{OUT1}$ output node in response to a corresponding "gate" signal G1 if the selected channel falls within its corresponding band, the $V^+_{OUT2}$ output node in response to a corresponding gate signal G2 if the selected channel falls within its corresponding band, or to a drain node in response to a "drain" signal such as D1. In this way receiver 100 can control the gain of LNA 110 using well-known automatic gain control (AGC) techniques.

Each tunable banpdass filter such as tunable bandpass filter 170 provides a sufficient amount of frequency selectivity in order to significantly reject frequencies outside the band of interest. Since a television receiver requires tuning over a large frequency range, such as 48 megahertz (MHz) to 870 MHz for a North American broadcast transmission (NTSC) systems, the receiver is partitioned into five portions corresponding to five bands of the spectrum forming separate outputs and filtered by corresponding bandpass filters.

When used in a television receiver, LNA 110 exhibits an inherent a tradeoff between noise figure (NF) and reflection loss (RL). LNA 110 would be more suitable for use in a cable television system by setting the input impedance to closely match resistance 102 and provide a good RL. LNA 110 would be more suitable for use in a terrestrial television system by reducing the input impedance to increase the gain of the amplifier and avoid the noise injected by integrated resistors, thereby reducing the NF. TABLE I below summarizes the desired NF and RL for both types of systems:

TABLE I

| Transmission system | NF | RL |
| --- | --- | --- |
| Terrestrial | Important | Don't care |
| Cable | Not important | Important |

In order to use LNA 110 in a universal television receiver that supports both terrestrial and cable signal sources, however, the designer must trade off good NF for good RL.

Figure 2:
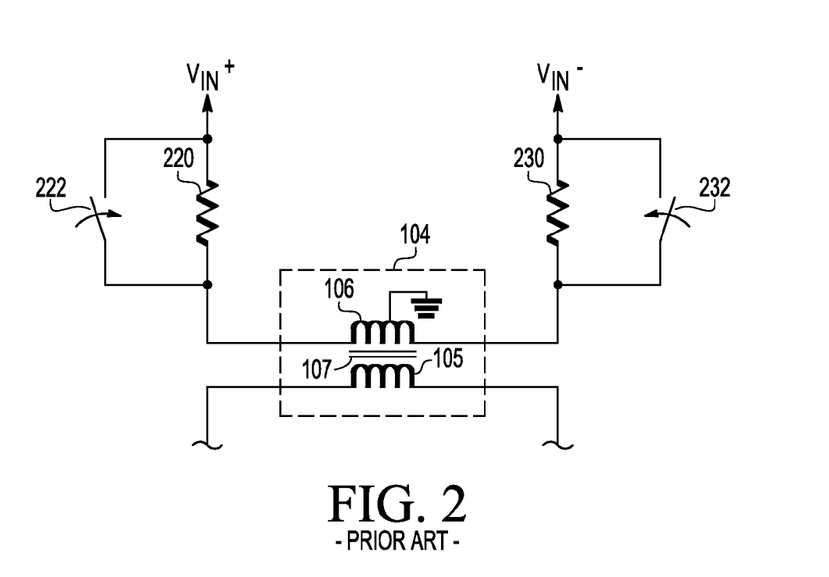
FIG. 2 illustrates in schematic form a known attenuator for use with the LNA of FIG. 1.

A solution to this dilemma that improves this tradeoff is shown in FIG. 2, which illustrates in schematic form a known attenuator 200 for use with LNA 110 of FIG. 1. Unlike the system of FIG. 1, system 200 selectively inserts a parallel combination of a resistor 220 and a switch 222 in the $V_{IN}^+$ path, as well as a parallel combination of a resistor 220 and a switch 222 in the $V_{IN}^-$ path. The receiver closes switches 222 and 232 in broadcast television mode, bypassing resistors 220 and 230 and helping to provide good NF. The receiver opens switches 222 and 232 in a cable television mode, causing an increase in input impedance by an amount equal to the resistance of resistors 220 and 230 and helping to provide good RL.

However the addition of attenuator 200 has drawbacks. Providing these elements as discrete elements at inputs of an integrated circuit receiver increases system cost. On the other hand integrating these elements with the rest of the receiver on the same chip causes another problem: in order to integrate switches 222 and 232 without adding significant series resistance, they must be implemented using very large MOS transistors, thereby deteriorating linearity and furthermore increasing die size and cost which are the main motivators behind integration in the first place.

The inventors have invented a new LNA that provides low NF in a terrestrial mode and low RL in a cable mode without significantly increasing die size over known LNAs such as LNA 110 of FIG. 1 and without requiring costly discrete components. The new LNA is based on the observation that input impedance can be made variable based on a capacitive division ratio. Such an LNA is illustrated with reference to FIG. 3, which illustrates in schematic form a low noise amplifier (LNA) 300 according to the present invention.

Figure 3:
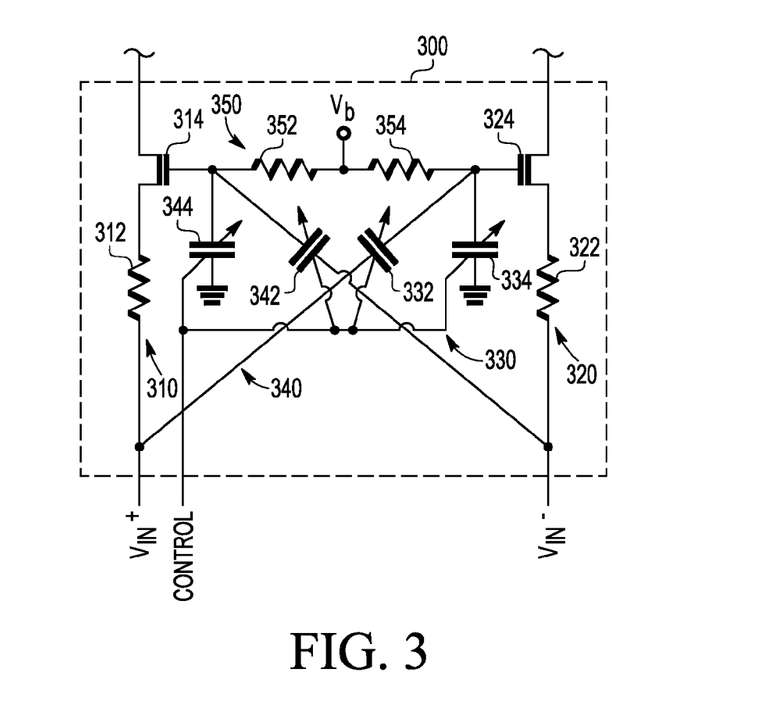
FIG. 3 illustrates in schematic form a low noise amplifier according to the present invention.

LNA 300 includes a first leg 310, a second leg 320, variable capacitive dividers 330 and 340, and a DC bias section 350. First leg 310 includes a resistor 312 and an N-channel MOS transistor 314. Resistor 312 has a first terminal for receiving signal $V_{IN}^+$, and a second terminal. Transistor 314 has a first source/drain terminal connected to the second terminal of resistor 312, a second source/drain terminal, and a gate.

Second leg 320 includes a resistor 322 and an N-channel MOS transistor 324. Resistor 322 has a first terminal for receiving signal $V_{IN}^-$, and a second terminal. Transistor 324 has a first source/drain terminal connected to the second terminal of resistor 322, a second source/drain terminal, and a gate.

Variable capacitive divider 330 includes variable capacitors 332 and 334. Variable capacitor 332 has a first terminal for receiving $V_{IN}^+$, a second terminal connected to the gate of transistor 324, and a control terminal for receiving a control signal labeled "CONTROL". Variable capacitor 334 has a first terminal connected to the second terminal of variable capacitor 334, a second terminal connected to ground, and a control terminal for receiving signal CONTROL.

Variable capacitive divider 340 includes variable capacitors 342 and 344. Variable capacitor 342 has a first terminal for receiving $V_{IN}^-$, a second terminal connected to the gate of transistor 314, and a control terminal for receiving signal CONTROL. Variable capacitor 344 has a first terminal connected to the second terminal of variable capacitor 342, a second terminal connected to ground, and a control terminal for receiving signal CONTROL.

DC bias section 350 includes resistors 352 and 354. Resistor 352 has a first terminal connected to the gate of transistor 314, and a second terminal for receiving bias voltage Vb. Resistor 354 has a first terminal connected to the gate of transistor 324, and a second terminal for receiving bias voltage Vb.

LNA 300 is suitable for use with the other components of the television receiver of FIG. 1 by connecting the second source/drain terminals of transistors 314 and 324 to transistors that selectively divert current to the respective output terminals or to a drain terminal based on control signals, as previously illustrated in FIG. 1. Additional legs could be added to support gain control in the manner previously illustrated in FIG. 1. Moreover it is possible to implement separate LNAs for tuning different bands to make use of different tunable bandpass filters as described with reference to FIG. 1.

In operation, LNA 300 allows a user to select low NF for terrestrial applications and low RL for cable applications, while being integrated on-chip without adding significantly to the die size. The input impedance is a function of capacitive division ratios, in which the input impedance as seen at the $V_{IN}^+$ terminal is scaled by the ratio $$\frac{C_{332}}{C_{332} + C_{334}},$$

and the input impedance as seen at the $V_{IN}^-$ terminal is scaled by the ratio $$\frac{C_{342}}{C_{342} + C_{344}}.$$

In particular, cable systems are ideally terminated using a terminator that closely matches the characteristic impedance of the transmission line. The extent of mismatch is frequently characterized by a reflection coefficient $\rho_L$, which is expressed as:

$$\rho_L = \frac{Z_0 - R_{IN}}{Z_0 + R_{IN}} \quad [1]$$

and a corresponding RL factor Γ, which is expressed as:

$$\Gamma = -20 \log(\rho_L) \quad [2]$$

Cable transmission systems desire as high a Γ as possible. For example, the DVB-C standard defined for European digital cable broadcast systems specifies that Γ must be greater than or equal to 8 decibels (dB).

TABLE II illustrates the values of NF and RL provided by an implementation of LNA 300 in contemporary CMOS integrated circuit technology:

TABLE II

| Transmission system | NF | RL (Γ) |
| --- | --- | --- |
| Terrestrial | 4 dB | Don't care |
| Cable | 7-8 dB | ≧8 dB |

Figure 4:
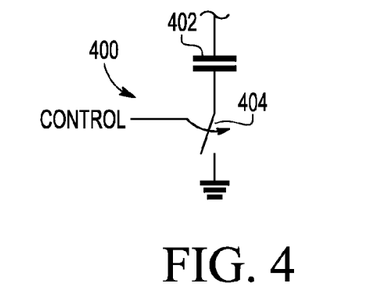
FIG. 4 illustrates in schematic form one embodiment of a variable capacitor suitable for use in the low noise amplifier of FIG. 3.

FIG. 4 illustrates in schematic form one embodiment of a variable capacitor 400 suitable for use as capacitor 334 or 344 in low noise amplifier 300 of FIG. 3. As shown, variable capacitor 400 includes a fixed capacitor 402 and a switch 404. Fixed capacitor 402 has a first terminal forming the first terminal of variable capacitor 400, and a second terminal. Switch 404 has a first terminal connected to the second terminal of fixed capacitor 402, a second terminal connected to ground, and a control terminal for receiving signal CONTROL.

Switch 404 is open in terrestrial mode but closed in cable mode. By placing switch 404 on the ground side terminal of capacitor 402, the series resistance of the transistor forming switch 404 does not inject significant noise into the receive path during cable mode. This configuration allows the transistor to be made small allowing LNA 300 to support cable mode without increasing die size significantly.

Figure 5:
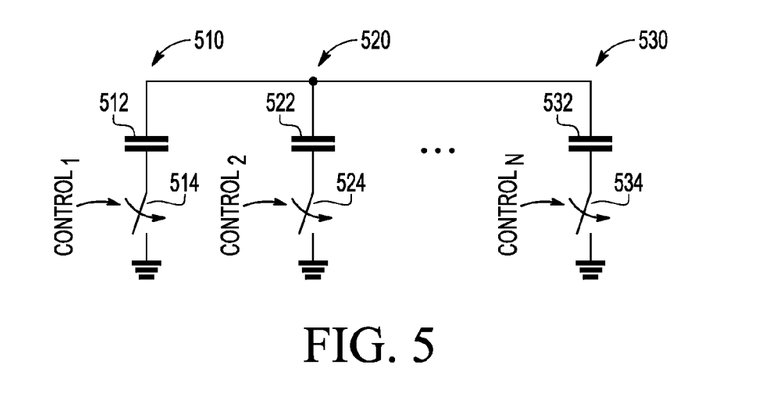
FIG. 5 illustrates in schematic form another embodiment of a variable capacitor suitable for use in the low noise amplifier of FIG. 3.

Alternatively, FIG. 5 illustrates in schematic form another embodiment of a variable capacitor 500 suitable for use as capacitor 334 or capacitor 344 in low noise amplifier 300 of FIG. 3. Variable capacitor 500 includes an arbitrary number of legs such as a first leg 510, a second leg 520, and an $N^{th}$ leg 530. Leg 510 includes a capacitor 512 and a switch 514. Capacitor 512 has a first terminal connected to a first terminal of variable capacitor 500, and a second terminal. Switch 514 has a first terminal connected to the second terminal of capacitor 512, a second terminal connected to ground, and a control terminal for receiving a component of signal CONTROL labeled "$CONTROL_1$". Leg 520 includes a capacitor 522 and a switch 524. Capacitor 522 has a first terminal connected to the first terminal of variable capacitor 500, and a second terminal. Switch 524 has a first terminal connected to the second terminal of capacitor 522, a second terminal connected to ground, and a control terminal for receiving a component of signal CONTROL labeled "$CONTROL_2$". Leg 530 includes a capacitor 532 and a switch 534. Capacitor 532 has a first terminal connected to the first terminal of variable capacitor 500, and a second terminal. Switch 534 has a first terminal connected to the second terminal of capacitor 532, a second terminal connected to ground, and a control terminal for receiving a portion of signal CONTROL labeled "$CONTROL_N$".

The capacitance of variable capacitor 500 can be selected by closing selected ones of the switches such as switches 514, 524, and 534 illustrated in FIG. 5. The capacitors in variable capacitor 500 can be binarily weighted to provide large range and granularity over that range. As in capacitor 400, the switches are connected to the capacitor terminals on the ground side to avoid injecting significant noise through the resistance in the switches. In an alternate embodiment, variable capacitors 334 and 344 can include uniformly weighted capacitors switched using thermometer coded control signals. In another alternate embodiment, variable capacitors 334 and 344 can include some binarily weighted capacitors switched using binarily weighted control signals with the remaining capacitors uniformly weighted and switched with thermometer coded control signals.

Figure 6:
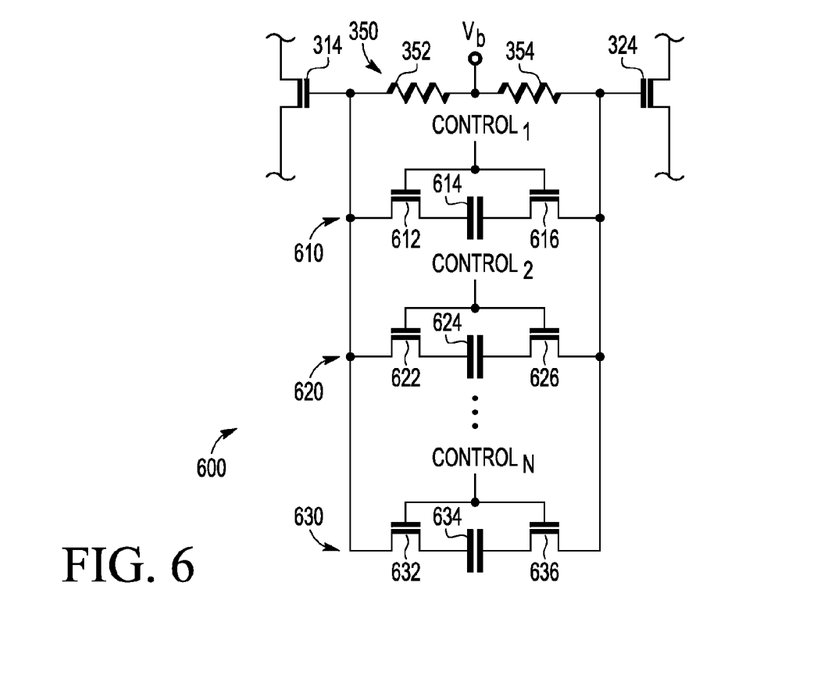
FIG. 6 illustrates in schematic form a portion of a low noise amplifier with a differential variable capacitor suitable for use in the low noise amplifier of FIG. 3.

FIG. 6 illustrates in schematic form a portion of an LNA using a variable differential capacitor 600 suitable for use in low noise amplifier 300 of FIG. 3. Also shown in FIG. 6 are transistors 314 and 324 and DC bias section 350 connected as previously described.

Differential capacitor 600 includes legs 610, 620, and 630. Leg 610 includes an N-channel MOS transistor 612, a capacitor 614, and an N-channel transistor 616. Transistor 612 has a first source/drain terminal connected to the gate of transistor 314, a gate for receiving signal $CONTROL_1$, and a second source/drain terminal. Capacitor 614 has a first terminal connected to the second source/drain terminal of transistor 612, and a second terminal. Transistor 616 has a first source/drain terminal connected to the second terminal of capacitor 614, a gate for receiving signal $CONTROL_1$, and a second source/drain terminal connected to the gate of transistor 324.

Leg 620 includes an N-channel MOS transistor 622, a capacitor 624, and an N-channel transistor 626. Transistor 622 has a first source/drain terminal connected to the gate of transistor 314, a gate for receiving signal $CONTROL_2$, and a second source/drain terminal. Capacitor 624 has a first terminal connected to the second source/drain terminal of transistor 622, and a second terminal. Transistor 626 has a first source/drain terminal connected to the second terminal of capacitor 624, a gate for receiving signal $CONTROL_2$, and a second source/drain terminal connected to the gate of transistor 324.

Leg 630 includes an N-channel MOS transistor 632, a capacitor 614, and an N-channel transistor 636. Transistor 632 has a first source/drain terminal connected to the gate of transistor 314, a gate for receiving signal $CONTROL_N$, and a second source/drain terminal. Capacitor 634 has a first terminal connected to the second source/drain terminal of transistor 632, and a second terminal. Transistor 636 has a first source/drain terminal connected to the second terminal of capacitor 634, a gate for receiving signal $CONTROL_N$, and a second source/drain terminal connected to the gate of transistor 324.

Variable capacitor 600 can be used in place of capacitors 334 and 344 and allow a reduction in the number of capacitors required, reducing integrated circuit size.

In addition to variable capacitors 334 and 344 being formed by either variable capacitor 400 of FIG. 4 or variable capacitor 500 of FIG. 5, and variable capacitors 332 and 342 being formed by differential capacitor 600 of FIG. 6, in another embodiment capacitors 332 and 342 in capacitive dividers 330 and 340, respectively, could be formed with fixed-valued capacitors while still allowing a degree of freedom in sizes and attenuation range. In yet another embodiment, each leg could include a single transistor with two capacitors each connected between a corresponding source/drain terminal of the transistor and the gate of either transistor 314 or transistor 324. In addition any of the switches previously referred to can be formed by full transmission gates each having an N-channel transistor in parallel with a P-channel transistor.

Figure 7:
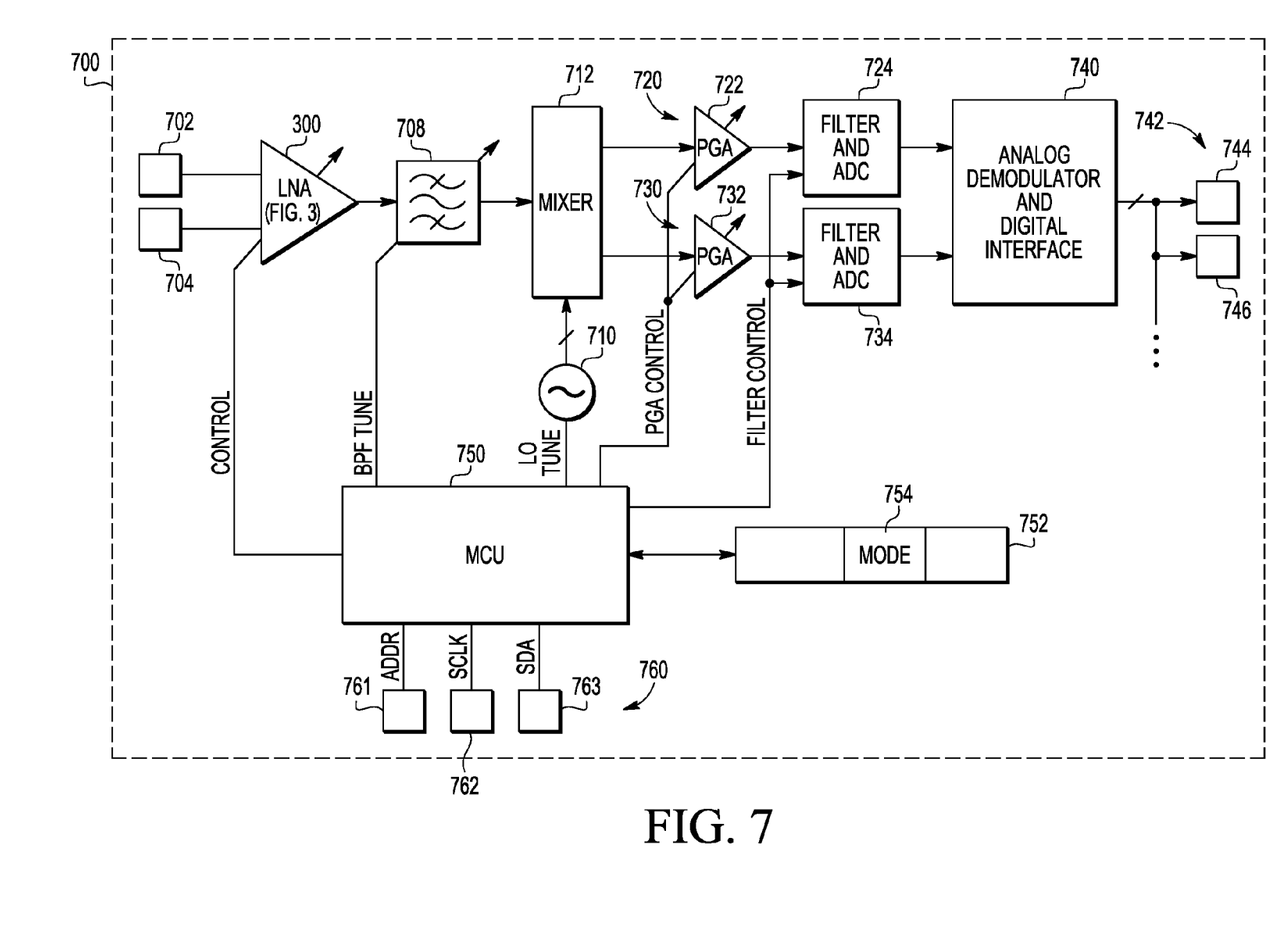
FIG. 7 illustrates in partial schematic and partial block diagram form a television receiver chip using the low noise amplifier of FIG. 3.

FIG. 7 illustrates in partial schematic and partial block diagram form a television receiver chip 700 using LNA 300 of FIG. 3. Television receiver chip 700 generally includes integrated circuit terminals 702 and 704, LNA 300, a tracking bandpass filter 708, a local oscillator 710, a mixer 712, an in-phase processing path 720, a quadrature path 730, an analog demodulator and digital interface 740, a television output interface 742, a microcontroller labeled "MCU" 750, a register 752, and a serial communication interface (SCI) port

760. Terminals 702 and 704 receive signals $V_{IN}^+$ and $V_{IN}^-$, respectively, using an off-chip transformer (not shown in FIG. 7) such as balun transformer 104 illustrated in FIG. 1 above. LNA 300 has a first input terminal connected to terminal 702, a second input terminal connected to terminal 704, a control input terminal for receiving signal CONTROL, and an output terminal. Filter 708 has a signal input terminal connected to the output terminal of LNA 300, a tuning input terminal for receiving a signal labeled "BPF TUNE", and a signal output terminal. As noted above, LNA 300 and bandpass filter 708 include multiple sections but are shown as single blocks for ease of illustration. In another embodiment, receiver 700 could use a single LNA and bandpass filter. Local oscillator 710 has an input for receiving a tuning control signal labeled "LO TUNE", and an output for providing a complex mixing signal made up of an in-phase mixing signal and a quadrature mixing signal that is ninety degrees out of phase with the in-phase mixing signal. Mixer 712 has a signal input terminal connected to the output terminal of filter 708, a local oscillator input terminal connected to the output terminal of local oscillator 710, and first and second signal output terminals for respectively providing in-phase and quadrature IF signals.

In-phase processing path 720 includes a programmable gain amplifier 722 labeled "PGA", and a filter and analog-to-digital converter (ADC) block 724. PGA 722 has an input connected the in-phase IF output of mixer 712, an output, and a control input for receiving a signal labeled "PGA CONTROL". Filter and ADC block 724 has an input connected to the output of PGA 722, an output, and a control input for receiving a signal labeled "FILTER CONTROL". Quadrature processing path 730 includes a PGA 732, and a filter and ADC block 734. PGA 732 has an input connected the quadrature IF output of mixer 712, an output, and a control input for receiving signal PGA CONTROL. Filter and ADC block 734 has an input connected to the output of PGA 732, an output, and a control input for receiving signal FILTER CONTROL.

Analog demodulator and digital interface 740 has a first input connected to the output of filter and ADC block 724, a second input connected to the output of filter and ADC block 734, and multiple output signals connected to television output interface 742. Analog demodulator and digital interface 740 provides, in an analog television mode, a demodulated analog television signal as one of the output signals to terminal 744. Analog demodulator and digital interface 740 provides, in a digital television mode, a partially demodulated digital television signal as another one of the output signals to terminal 746 for further processing in an off-chip digital demodulator, not shown in FIG. 7. Interface 742 includes additional signals such as audio signals, etc. but these are not shown in detail in FIG. 7.

MCU 750 is bidirectionally connected to SCI port 760 and to register 752, and provides the CONTROL, BPF TUNE, LO TUNE, PGA CONTROL, and FILTER CONTROL signals as output signals, plus a variety of control signals not specifically illustrated in FIG. 7. SCI port 760 includes a first integrated circuit terminal 761 for receiving an address signal labeled "ADDR", a second integrated circuit terminal 762 for receiving a clock signals labeled "SCLK", and a third bidirectional terminal 763 for conducting data bidirectionally via a signal labeled "SDA". Register 752 includes a field 754 labeled "MODE" for storing a mode bit indicating one of a terrestrial mode and a cable mode.

In operation, MCU 750 controls the operation and the modes of receiver 700 based on user input from serial communication port 760. The operation of SCI port 760 is conventional and details of the operation thereof are well-known to those in the art. A user sends commands and data to control the operation of receiver 700 through SCI port 760. The user also writes to register 752 to place receiver 700 into either a terrestrial mode or a cable mode. In response to the user placing receiver 700 in a terrestrial mode, firmware in MCU 750 causes the CONTROL signal to configure LNA 706 to operate in low NF mode. In response to the user placing receiver 700 in a cable mode, firmware in MCU 750 causes the CONTROL signal to configure LNA 706 to operate in high RL mode.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A low-noise amplifier comprising:
    a first transconductance path having a first terminal for receiving a first input signal, a control terminal, and a second terminal for providing a first output signal;
    a second transconductance path having a first terminal for receiving a second input signal, a control terminal, and a second terminal for providing a second output signal;
    a first variable capacitive divider having a first terminal for receiving said first input signal, a second terminal coupled to a reference voltage terminal, and an intermediate terminal coupled to said control terminal of said second transconductance path; and
    a second variable capacitive divider having a first terminal for receiving said second input signal, a second terminal coupled to said reference voltage terminal, and an intermediate terminal coupled to said control terminal of said first transconductance path.

2. The low-noise amplifier of claim 1, wherein each of said first and second variable capacitive dividers further have a control terminal for receiving a control signal, said control signal determining a fraction of said first and second input signals provided to respective intermediate terminals.

3. The low-noise amplifier of claim 2, wherein said first capacitive divider comprises:
    a first capacitor having a first terminal for receiving said first input signal, and a second terminal forming said intermediate terminal; and
    a variable capacitor having a first terminal coupled to said second terminal of said first capacitor, a control terminal for receiving said control signal, and a second terminal coupled to said reference voltage terminal.

4. The low-noise amplifier of claim 3, wherein said variable capacitor comprises:
    a second capacitor having a first terminal coupled to said second terminal of said first capacitor, and a second terminal; and
    a switch having a first terminal coupled to said second terminal of said second capacitor, a control terminal for receiving said control signal, and a second terminal coupled to said reference voltage terminal.

5. The low-noise amplifier of claim 3, wherein said control signal comprises a multiple-bit digital signal, and said variable capacitor comprises a plurality of legs, each leg comprising:
    a second capacitor having a first terminal coupled to said second terminal of said first capacitor, and a second terminal; and
    a switch having a first terminal coupled to said second terminal of said second capacitor, a control terminal for receiving a corresponding bit of said multiple-bit digital signal, and a second terminal coupled to said reference voltage terminal.

6. The low-noise amplifier of claim 3, further comprising:
a control circuit for providing said control signal to set said variable capacitor to a first value in response to a mode signal indicating a low noise figure (NF) mode, and to a second value lower than said first value in response to said mode signal indicating a low reflection loss (RL) mode.

7. The low-noise amplifier of claim 6, further comprising:
a register coupled to said control circuit having a field for storing said mode signal.

8. The low-noise amplifier of claim 1, wherein said first transconductance path comprises:
a resistor having a first terminal for receiving said first input signal, and a second terminal; and
a transistor having a first current electrode coupled to said second terminal of said resistor, a control electrode forming said control terminal of said first transconductance path, and a second current electrode forming said second terminal of said first transconductance path.

9. The low-noise amplifier of claim 8, wherein said transistor comprises a metal-oxide-semiconductor (MOS) transistor.

10. An integrated circuit comprising:
a first integrated circuit terminal for receiving a first input signal;
a second integrated circuit terminal for receiving a second input signal, wherein said first and second input signals form a differential input signal pair; and
a low noise amplifier having a first input terminal coupled to said first integrated circuit terminal, a second input terminal coupled to said second integrated circuit terminal, and an output terminal,
said low noise amplifier comprising:
a first transconductance path having a first terminal for receiving a first input signal, a control terminal, and a second terminal for providing a first output signal;
a second transconductance path having a first terminal for receiving a second input signal, a control terminal, and a second terminal for providing a second output signal;
a first variable capacitive divider having a first terminal for receiving said first input signal, a second terminal coupled to a reference voltage terminal, and an intermediate terminal coupled to said control terminal of said second transconductance path; and
a second variable capacitive divider having a first terminal for receiving said second input signal, a second terminal coupled to said reference voltage terminal, and an intermediate terminal coupled to said control terminal of said first transconductance path.

11. The integrated circuit of claim 10, wherein each of said first and second variable capacitive dividers further have a control terminal for receiving a control signal, said control signal determining a fraction of said first and second input signals provided to respective intermediate terminals.

12. The integrated circuit of claim 11, wherein said first capacitive divider comprises:
a first capacitor having a first terminal for receiving said first input signal, and a second terminal forming said intermediate terminal; and
a variable capacitor having a first terminal coupled to said second terminal of said first capacitor, a control terminal for receiving said control signal, and a second terminal coupled to said reference voltage terminal.

13. The integrated circuit of claim 11, further comprising:
a third integrated circuit terminal for receiving a data signal, wherein said integrated circuit forms said control signal in response to said data signal.

14. The integrated circuit of claim 13, further comprising:
a register having a field for storing said data signal.

15. The integrated circuit of claim 10, wherein said first transconductance path comprises:
a resistor having a first terminal for receiving said first input signal, and a second terminal; and
a transistor having a first current electrode coupled to said second terminal of said resistor, a control electrode forming said control terminal of said first transconductance path, and a second current electrode forming said second terminal of said first transconductance path.

16. The integrated circuit of claim 15, wherein said transistor comprises a metal-oxide-semiconductor (MOS) transistor.

17. A radio frequency receiver comprising:
a low noise amplifier comprising:
a first transconductance path having a first terminal for receiving a first input signal, a control terminal, and a second terminal for providing a first output signal;
a second transconductance path having a first terminal for receiving a second input signal, a control terminal, and a second terminal for providing a second output signal;
a first variable capacitive divider having a first terminal for receiving said first input signal, a second terminal coupled to a reference voltage terminal, and an intermediate terminal coupled to said control terminal of said second transconductance path; and
a second variable capacitive divider having a first terminal for receiving said second input signal, a second terminal coupled to said reference voltage terminal, and an intermediate terminal coupled to said control terminal of said first transconductance path
a bandpass filter coupled to said second terminals of said first and second transconductance paths, for filtering said first and second output signals in response to a first tuning signal;
a local oscillator having an output for providing a local oscillator signal at a frequency determined by a second tuning signal;
a mixer having an input for receiving said local oscillator signal, and outputs for providing in-phase and quadrature signals at another frequency; and
processing circuitry for processing said in-phase signal and said quadrature signal to provide a received output signal.

18. The radio frequency receiver of claim 10, wherein each of said first and second variable capacitive dividers further have a control terminal for receiving a control signal, said control signal determining a fraction of said first and second input signals provided to respective intermediate terminals.

19. The integrated circuit of claim 18, wherein said first capacitive divider comprises:
a first capacitor having a first terminal for receiving said first input signal, and a second terminal forming said intermediate terminal; and
a variable capacitor having a first terminal coupled to said second terminal of said first capacitor, a control terminal for receiving said control signal, and a second terminal coupled to said reference voltage terminal.

20. The integrated circuit of claim 18, further comprising:
a register having a field for storing a mode signal; and
a control circuit coupled to said register for providing said control signal to set said variable capacitor to a first value in response to said mode signal indicating a low noise figure (NF) mode, and to a second value lower than said first value in response to said mode signal indicating a low reflection loss (RL) mode.

* * * * *

UNITED STATES PATENT AND TRADEMARK OFFICE
CERTIFICATE OF CORRECTION

PATENT NO. : 8,238,867 B1
APPLICATION NO. : 13/036892
DATED : August 7, 2012
INVENTOR(S) : Ramin Khoini-Poorfard It is certified that error appears in the above-identified patent and that said Letters Patent is hereby corrected as shown below:

In column 10, line 68, replace "multiple-hit" with "multiple-bit".

Signed and Sealed this
Fourth Day of December, 2012

David J. Kappos
*Director of the United States Patent and Trademark Office*